(12) United States Patent
Pannaccione et al.

(10) Patent No.: US 6,373,125 B1
(45) Date of Patent: Apr. 16, 2002

(54) CHIP SCALE PACKAGE WITH DIRECT ATTACHMENT OF CHIP TO LEAD FRAME

(75) Inventors: Paul J. Pannaccione, Brookfield, CT (US); James M. Moniz, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/511,396

(22) Filed: Feb. 23, 2000

(51) Int. Cl.[7] ............................................. H01L 23/495
(52) U.S. Cl. ...................... 257/666; 257/678; 257/684; 257/782
(58) Field of Search ........................ 257/678, 701–707, 257/666, 684, 796, 787–793, 654

(56) References Cited

U.S. PATENT DOCUMENTS

| | | | |
|---|---|---|---|
| 3,691,289 A | | 9/1972 | Roholff |
| 3,765,590 A | | 10/1973 | Duffek et al. |
| 4,109,096 A | | 8/1978 | Dehaine |
| 4,183,135 A | | 1/1980 | Welling |
| 4,312,926 A | | 1/1982 | Burns |
| 4,657,170 A | | 4/1987 | Müller |
| 4,999,699 A | * | 3/1991 | Christie et al. .............. 257/778 |
| 5,034,349 A | | 7/1991 | Landis |
| 5,080,279 A | | 1/1992 | Davison |
| 5,146,310 A | * | 9/1992 | Bayan et al. ................ 257/675 |
| 5,289,344 A | * | 2/1994 | Gagnon et al. .............. 361/712 |
| 6,034,422 A | * | 3/2000 | Horita et al. ................ 257/677 |
| 6,160,312 A | * | 12/2000 | Raad et al. .................. 257/723 |
| 6,184,573 B1 | * | 2/2001 | Pu ............................... 257/666 |
| 6,191,952 B1 | * | 2/2001 | Jimarez et al. ............. 361/771 |
| 6,232,148 B1 | * | 5/2001 | Ma et al. ..................... 438/112 |
| 6,258,622 B1 | * | 7/2001 | Lin et al. ..................... 438/106 |

\* cited by examiner

*Primary Examiner*—Minh Loan Tran
*Assistant Examiner*—Thomas L. Dickey
(74) *Attorney, Agent, or Firm*—Ratner & Prestia; Ira D. Blecker, Esq.

(57) ABSTRACT

A chip scale package with outer dimensions for high of semiconductor chips to facilitate handling, testing, and later attachment of the package to further electrical circuitry. The chip scale package has four main components: semiconductor chip, a lead frame, a connection between the semiconductor chip and the lead frame, and an encapsulation sealing the semiconductor chip from the surrounding atmosphere. The semiconductor chip has a body, an active surface, and the dimensions that are between about 70% and 80% of the outer dimensions of the chip scale package. The lead frame has an intermediate path directly in line with, and perpendicular to, the surface of the semiconductor chip, thereby minimizing parasitic inductance and capacitance, and a thermal or ground slug.

16 Claims, 4 Drawing Sheets

CHIP SCALE PACKAGE WITH DIRECT ATTACHMENT OF CHIP TO LEAD FRAME

TECHNICAL FIELD

The present invention relates generally to the packaging of semiconductor devices and, more particularly, to an encapsulated chip scale package.

BACKGROUND OF THE INVENTION

In the electrical industry, semiconductor devices (e.g., transistors, integrated circuit chips, and the like) are often permanently attached to the desired electrical circuitry by first connecting the miniature semiconductor device to a lead frame. The lead frame is then connected to the desired circuit. After the semiconductor device has been connected to the lead frame, the device may be tested to determine whether it has the requisite electrical and mechanical characteristics.

In addition, it is desirable to seal or otherwise package the semiconductor device and an area encompassing the ends of the lead frame so that the device resists environmental moisture and physical abuse. Such moisture and abuse may adversely affect the electrical properties of the device. In many conventional designs, semiconductor devices are sealed by using ceramic or metal enclosures that are relatively expensive and complicated to manufacture. Also, substantial labor is required to mount the device within the ceramic or metal enclosure and to connect external leads to the device. Increased costs and complicated manufacturing steps are to be avoided. Therefore, plastics (e.g., resins) are also used to encapsulate the semiconductor device and lead frame ends. Resin encapsulation is typically done in a controlled-humidity atmosphere after the semiconductor device has been bonded to the lead frame but before the lead frame is attached to further electrical circuitry.

An essential step in the fabrication of semiconductor device packages is the formation of electrical contacts to the device. For purposes of example, consider an integrated circuit chip as the semiconductor device. The chip is typically mounted on a support member, commonly termed a die paddle, and electrically contacted through leads from the lead frame. The leads extend to the area outside of the package.

As might be expected, several techniques have been developed for making good electrical contacts between the chip and the leads. One exemplary technique forms the contacts by wire bonding. In this technique, individual wires are attached to a lead and a corresponding site on the chip; i.e., there is one site on the chip for each lead. The wires are typically gold. Another exemplary technique bonds the leads directly to solder or gold bumps on the chip. The leads are typically on a metal tape with one set of leads for each chip. The latter technique of forming the contacts can be highly automated and, in its automated form, is generally referred to as Tape Automated Bonding (TAB).

U.S. Pat. No. 5,080,279 discloses a method of manufacturing packages using the step of bonding a plurality of leads to sites (i.e., contact pads) on a substrate. The bonding step includes the further steps of clamping the leads into contact with the pads using a plate; heating the pads and leads with a thermode held at constant temperature and in contact with the plate; monitoring the temperature of the plate and removing the thermode from the plate when the material of the pads has melted; and removing the plate from the leads when the material has cooled sufficiently to form bonds. In a preferred embodiment, the pads are solder. In a further preferred embodiment, the substrate is an integrated circuit chip. In another embodiment, the substrate is a printed wiring board.

Thus, the method described in the '279 patent may be used to attach a surface mount integrated circuit package to a printed wiring board. Such an assembly is depicted in a sectional view in FIG. 3. FIG. 3 shows a printed wiring board 31, a lead frame 33, an integrated circuit chip 35, an encapsulation 37, leads 39, a clamping plate 41, a thermode 43, and bumps 45 attaching leads 39 to printed wiring board 31. The portion of thermode 43 that contacts clamping plate 41 has a flat face; thermode 43 has a small cavity in which lead frame 33 and chip 35 fit together with associated elements. The bumps 45 are located on the printed wiring board 31.

The method disclosed by the '279 patent has several disadvantages. First, relatively long leads 39 connect the chip 35 to the printed wiring board 31 external to the chip package. Leads 39 are attached to lead frame 33 at the periphery of the chip package, and only indirectly to chip 35. This configuration creates undesirable parasitic inductance. Second, relatively complex structure is required to connect leads 39 to printed wiring board 31: thermode 43, clamping plates 41, and bumps 45.

The deficiencies of the conventional semiconductor packages show that a need still exists for an improved semiconductor package. To overcome the shortcomings of the conventional packages, a new semiconductor package is provided. An object of the present invention is to eliminate wire bonds. Another object is to attach the semiconductor device directly to the lead frame. A related object is to avoid the need for a die paddle on the lead frame. Still another related object is to minimize package parasitics, including lead frame capacitance and inductance and bond wire inductance.

Yet another object of the present invention is to provide a semiconductor package that allows minimal package size. A further object of the present invention is to provide a built-in thermal slug capable of thermal dissipation. Still another object of the present invention is to assure good RF performance, equivalent to flip chip attach, while providing a plastic package for conventional surface mount technology handling techniques and eliminating handling concerns prevalent with the bare silicon and underfill process.

SUMMARY OF THE INVENTION

To achieve these and other objects, and in view of its purposes, the present invention provides a chip scale package with outer dimensions for housing of semiconductor devices to facilitate handling, testing, and later attachment of the devices to further electrical circuitry. The chip scale package has four main components: a semiconductor device, a lead frame, a connection between the semiconductor device and the lead frame, and an encapsulation sealing the semiconductor device from the surrounding atmosphere. The semiconductor device has a body, an active surface, and outer dimensions that are between about 70% and 80% of the outer dimensions of the chip scale package. The lead frame has ends extending less than about 0.2 mm beyond the body of the semiconductor device and a solderable surface directly in line with and perpendicular to the surface of the integrated circuit, thereby minimizing parasitic inductance and capacitance, and a thermal slug removing heat from the semiconductor device with minimal thermal resistance.

Preferably, the semiconductor device is an integrated circuit chip. The connection between the semiconductor device and the lead frame is achieved, also preferably, using controlled-collapsed-chip-connection (C4) bumps. The C4 bumps electrically and mechanically connect the lead frame directly and without intervening structure to, and flush with, the entire active surface of the semiconductor device.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
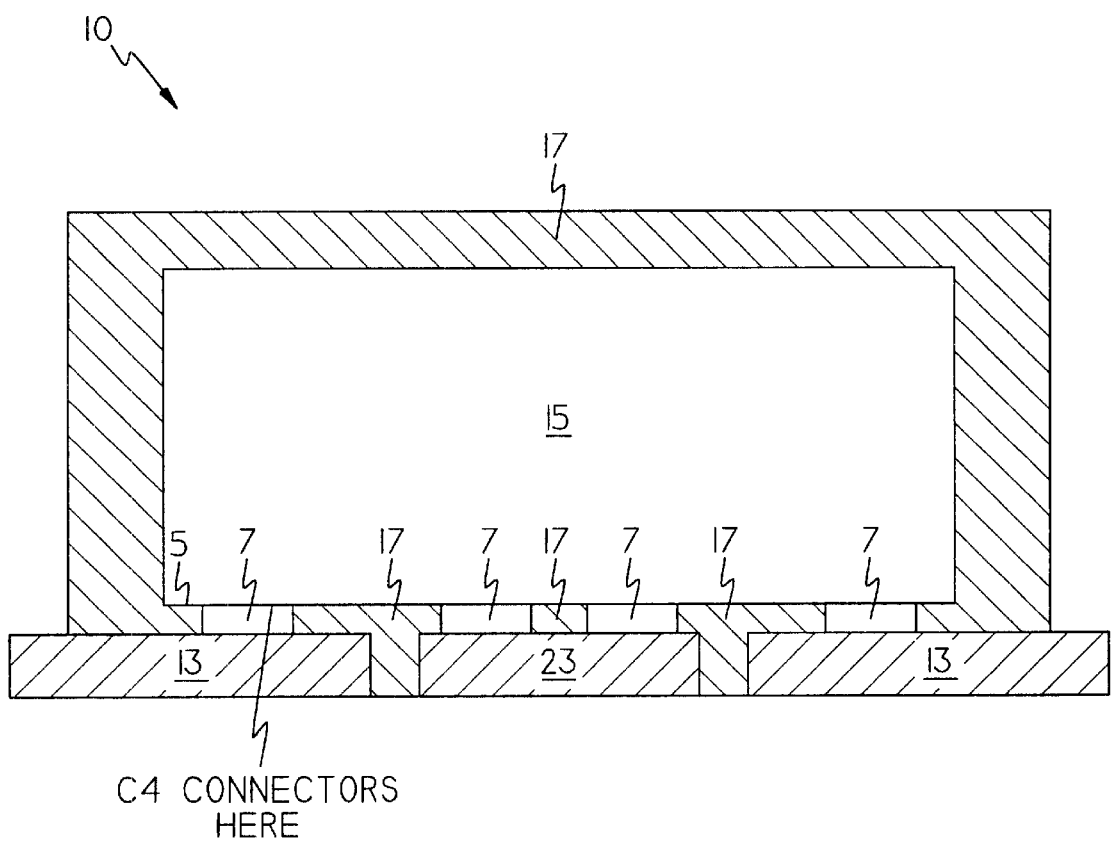
FIG. 1 is a cross-sectional view of a first embodiment of the chip scale package of the present invention, including an element that functions as a thermal slug, a ground slug, or both.

Referring now to the drawing, wherein like reference numerals refer to like elements throughout, FIG. 1 is a cross-sectional view of a first embodiment of the chip scale package 10 of the present invention. The central component of chip scale package 10 is, of course, the semiconductor device which, in the illustrated example, is an integrated circuit chip 15.

Chip 15 is typically made of silicon and has active circuitry (not shown) formed on the lower surface 5 of chip 15. Thus, lower surface 5 of chip 15 is the "active" surface. A passivation layer of silicon oxide is typically formed over the active circuitry to protect the active circuitry from the environment. A plurality of contact areas or contact pads (not shown) are formed on active surface 5 of chip 15 in contact with the active circuitry. The contact pads extend downwardly below the active circuitry so that other components may be easily attached to the contact pads and, therefore, to chip 15 using one of a number of interconnection techniques.

The type of interconnection used in the present invention is the type known as "C4 bumps." The term "C4" means the controlled-collapsed-chip-connection technique used to connect semiconductor chips to other conductive components or layers. C4 is also known as the "solder bump" or "flip chip" technique and represents an advanced microelectronic chip packaging and connection technology.

The basic idea of C4 is to connect chip packages by solder balls placed between two surfaces. In the present invention, the solder balls are preferably formed of 97% lead and 3% tin. Solder balls of 95% lead and 5% tin, and other high-lead compositions, are also suitable. These tiny balls of electrically conductive solder bridge the gaps between respective pairs of metal pads on the components being connected. Each pad has a corresponding pad on the surface of the other component so that the pad arrangements are mirror images. As the components are aligned and exposed to temperatures above the melting point of the solder, the solder balls on the pads of the first component (chip 15 in FIG. 1) become molten and join to corresponding conductive pads (having no solder balls) on the second component (lead frame 13 in FIG. 1), making permanent connections between respective pads and, therefore, the respective components. A 97% lead and 3% tin solder melts and flows at over 300° C.

In C4, the solder balls or C4 bumps 7 typically are formed directly on the metal pads of the one surface. C4 bumps 7 are electrically isolated from each other by the insulating material that surrounds each ball. The bottom of each C4 bump 7 is electrically and mechanically connected to the circuitry on chip 15. When C4 bumps 7 are aligned to the metal pads (not shown) on the surface of lead frame 13 and reflowed, the liquid solder C4 bumps 7 wet the receiving pads. Upon cooling, relatively low-stress solder joints are formed. This process allows all of the connections to be made in one step, even with slight variations in the topography of the mating surfaces.

Chips 15 may be made in rectangular arrays on a monocrystalline slab of silicon, called a "wafer," which is a thin disc typically several centimeters across. Many chips 15 may be formed on each wafer, then the wafer is diced into individual chips 15 and chips 15 are "packaged" in units large enough to be handled. C4 bumps 7 are placed on chips 15 while chips 15 are still in wafer form.

The wafers may be made as large as possible so as to reduce the number of wafers that must be processed to make a certain number of chips 15. For the same reason, among others, chips 15 may be made as small as possible. Thus, the best C4 fabrication system is one that can make thousands of very small, closely spaced solder balls each precisely placed over a large area.

C4 allows a very high density of electrical interconnections. Unlike earlier techniques that made connections around the perimeter of chip 15 or chip scale package 10, C4 allows one or more surfaces of chip 15 or chip scale package 10 to be packed with pads. The number of possible connections with C4 is roughly the square of the number that is possible with perimeter connection. Because C4 bumps 7 can be made quite small, less than one quarter of a millimeter in diameter, the surface density of C4 connections can be on the order of thousands per square millimeter.

Electrical engineers are constantly placing more and more circuits onto each chip 15 to improve performance and reduce cost. As the number of circuits on chip 15 grows, so does the number of connections needed. Because the C4 technique allows more connections in a small space than any other technique, the C4 technique is commercially important.

The C4 technique is used in the present invention to attach chip 15 directly to lead frame 13 without any intervening structure, such as wire bonds. Moreover, no die paddle is required during the manufacturing process. The material of lead frame 13 can be any electrically conductive material desired that is compatible with the underlying metallurgy of chip 15 and with the package materials. Lead frame 13 is preferably a stamped or etched copper component with solder plating on external exposed surfaces. Lead frame 13 may also be copper plated with gold, palladium, nickel, silver, and the like.

Lead frame 13 is electrically and mechanically connected to active surface 5 of chip 15 without any intervening packaging structure. The connection between chip 15 and lead frame 13 provides a direct, vertical electrical path between chip 15 and lead frame 13. Therefore, the inductance of chip scale package 10 is minimized and the RF performance of chip scale package 10 is enhanced relative to conventional semiconductor packages. Because chip scale package 10 of the present invention attaches chip 15 directly to lead frame 13, the need for separate lead wires is eliminated. Consequently, the number of bonding steps required to form chip scale package 10 is reduced. In addition, the method of packaging the semiconductor device using the design of the present invention is efficient because the method can be completed in a continuous manner.

In the embodiment of the present invention illustrated in FIG. 1, a portion of lead frame 13 is a slug 23. Slug 23 is preferably made of the same material as the rest of lead frame 13. Slug 23 is connected via C4 bumps 7 directly to the center of chip 15. Therefore, slug 23 provides a direct, vertical path able to remove heat from chip 15 with minimal thermal resistance (i.e., to act as a thermal slug), to ground chip 15 (i.e., to act as a ground slug), or both.

It is essential to seal semiconductor chip 15 from the surrounding atmosphere so that chip 15 is resistant to water vapor and other moisture in the air. If the metallization on active surface 5 of chip 15 is allowed to contact water vapor, other moisture, or other atmospheric gases, the operation and the life of the active circuitry can be adversely effected. To prevent the contact of moisture and gases with the metallization on chip 15, it is common to encapsulate chip 15 so as to seal chip 15 from the atmosphere.

The present invention seals chip 15, to complete chip scale package 10, after chip 15 is attached to lead frame 13. Some conventional packages seal only the active surface and chip interconnect contact areas. Direct flip chip to a board also requires underfill for this purpose. In the present invention, however, the entire chip 15 is encapsulated along with the contact areas between chip 15 and lead frame 13—as shown in FIG. 1. Moreover, encapsulation 17 provides electrical separation between slug 23 and the remainder of lead frame 13. Because the entire chip 15 is encapsulated, the number of operations and amount of labor required to encapsulate chip 15 is minimized. Many conventional devices rely upon the encapsulation to support the leads. By using C4 bumps 7 to bond chip 15 directly to lead frame 13, however, reliance on encapsulation 17 for additional support is unnecessary.

Resins useful as encapsulation 17 for covering and sealing chip 15 in chip scale package 10 of the present invention are any of those resins that adhere well to chip 15 and lead frame 13 and that do not allow significant moisture vapor transmission. The encapsulating resin may be, for example, a powdered resin, a cross-linked resin, or a hot-melt resin. Particularly useful materials for encapsulation 17 are epoxies, silicones, polyurethanes, and polyimides.

After encapsulation, chip scale package 10 appears as shown in FIG. 1. The entire active surface 5 of chip 15 is bonded, using C4 bumps 7, to lead frame 13. Moreover, lead frame 13 is flush with active surface 5 of chip 15 and does not extend outward from the body of chip 15 (in contrast to many conventional packages). The fingers that comprise lead frame 3 are relatively short stubs (rather than the long leads used in conventional packages). These design attributes of the present invention minimize parasitic inductance and capacitance, providing performance advantages over conventional packages.

Figure 2A:
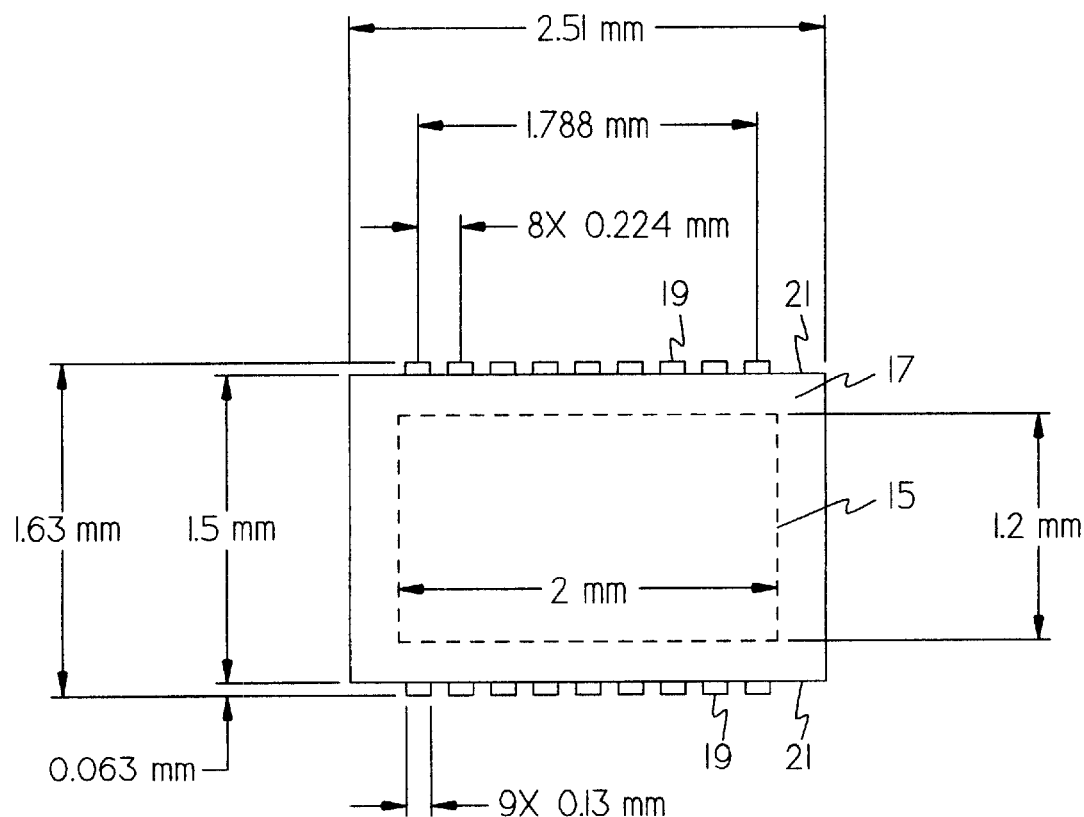
FIG. 2A is a top view of a second embodiment of the chip scale package of the present invention.

FIG. 2A is a top view of a second embodiment of the chip scale package 10 of the present invention. Chip 15 is illustrated as a rectangular component having a width of approximately 1.2 mm and a length of approximately 2 mm. Similarly, molded encapsulation 17 forms a rectangular block having approximate dimensions of 1.5 mm by 2.51 mm. Lead frame 13 has ends 19 that project slightly beyond the edges 21 of encapsulation 17. As illustrated in FIG. 2A, such projection is about 0.063 mm given that the width of lead frame 13 is about 1.63 mm. The length of each end 19 of lead frame 13 is about 0.13 mm and the center-to-center separation between ends 19 is about 0.224 mm. There are nine ends 19 illustrated, for purposes of example only, in FIG. 2A; therefore, the length of lead frame 13 from the center of the first end 19 to the center of the ninth end 19 is about 1.788 mm. A larger or smaller number of ends 19 might be suitable, depending on the particular application for chip scale package 10.

A comparison between the dimensions of chip 15 and the dimensions of encapsulation 17, which defines the outer dimensions of chip scale package 10, shows that chip scale package 10 is only about 20–30% larger than chip 15 itself. For the example chip scale package illustrated in FIG. 2A, the width of chip 15 is 1.2 mm, which is 80% of the width of 1.5 mm for encapsulation 17. The length of chip 15 is 2 mm, which is again 80% of the length of 5.51 mm for encapsulation 17. Thus, in this example, chip scale package 10 is only 20% larger than chip 15 itself.

Figure 2B:
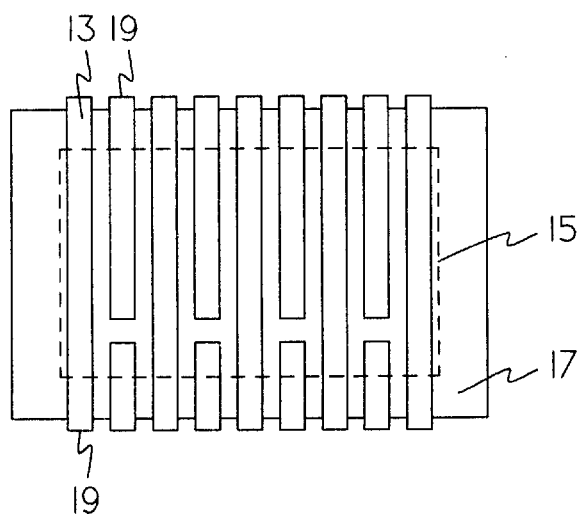
FIG. 2B is a bottom view of the chip scale package illustrated in FIG. 2A.

FIG. 2B is a bottom view of the embodiment of chip scale package 10 illustrated in FIG. 2A. The pattern illustrated for lead frame 13 is only one of the almost infinite variety of patterns suitable for lead frame 13. The pattern of lead frame 13 depends, of course, on the particular application for chip scale package 10 and may include a thermal slug, a ground slug, or an element that combines the functions of both a thermal slug and a ground slug.

Figure 2C:
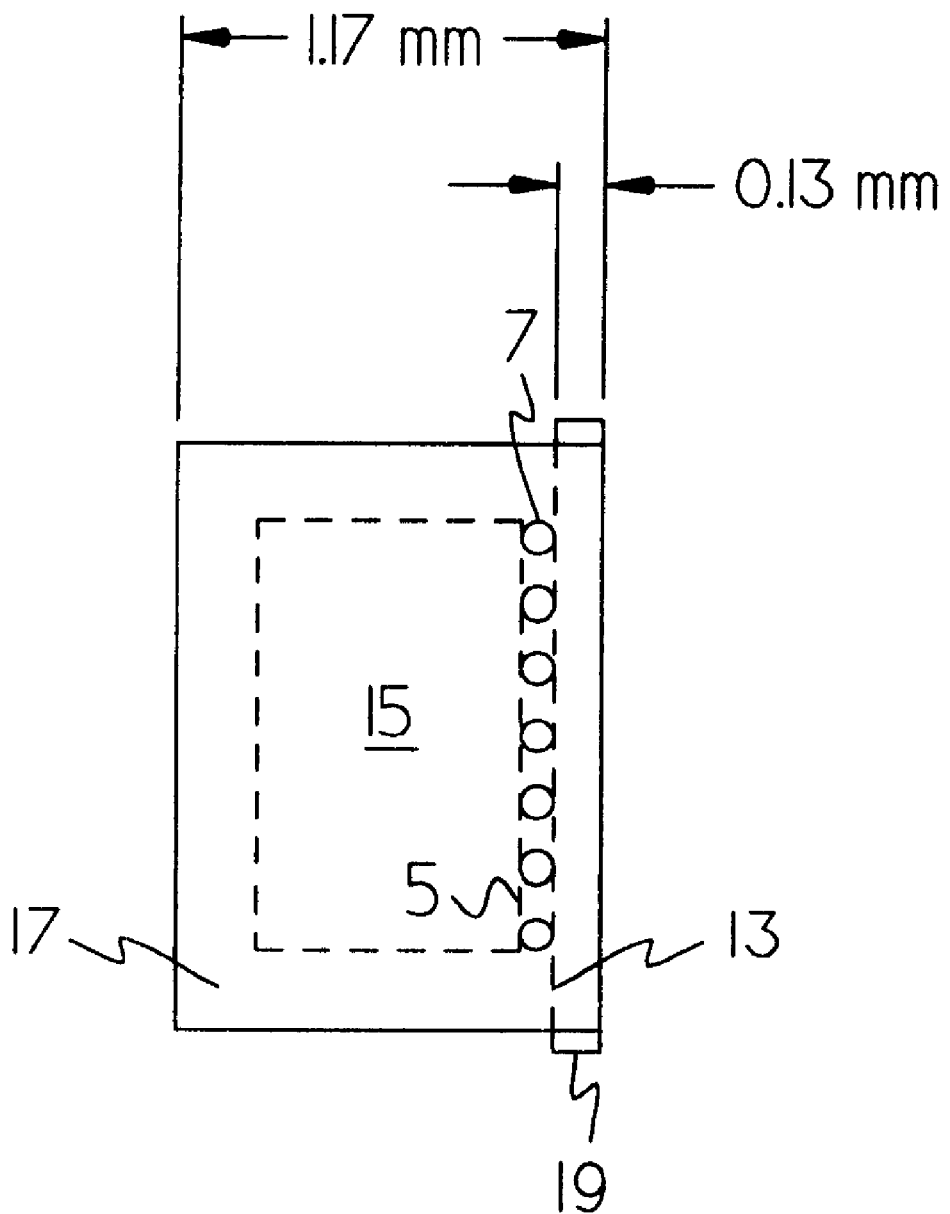
FIG. 2C is a side view of the chip scale package illustrated in FIGS. 2A and 2B.
Figure 3:
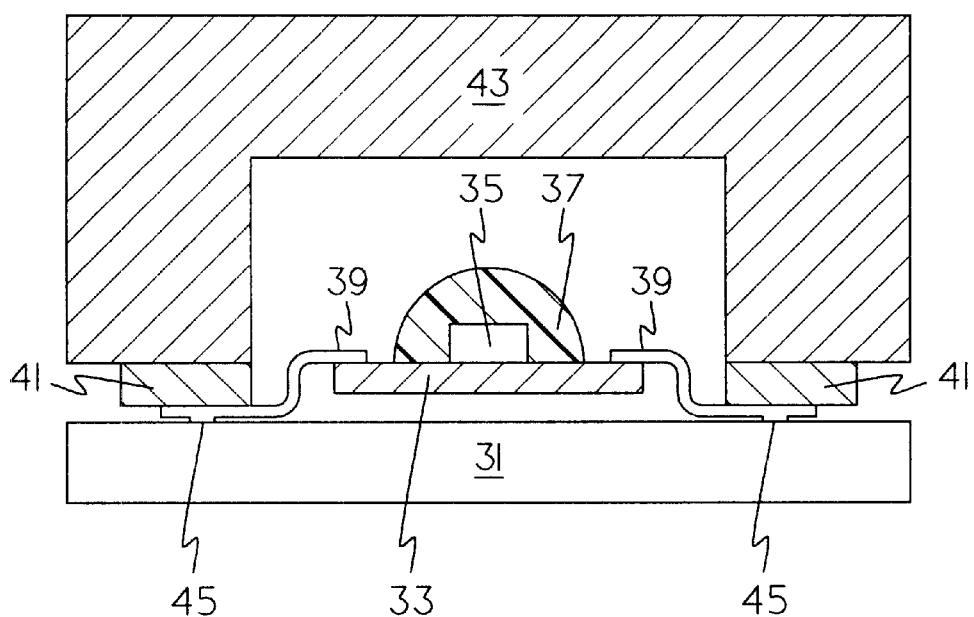
FIG. 3 is a cross-sectional view of a conventional package made according to U.S. Pat. No. 5,080,279.

FIG. 2C is a side view of the embodiment of chip scale package 10 illustrated in FIGS. 2A and 2B. C4 bumps 7 directly connect chip 15 to lead frame 13 continuously along the entire active surface 5 of chip 15. As illustrated in FIG. 2C, encapsulation 17 has a height of about 1.04 mm and ends 19 of lead frame 13 each have a height of about 0.13 mm. Therefore, chip scale package 10 has a height of about 1.17 mm.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A chip scale package for housing of semiconductor devices to facilitate handling, testing, and later attachment of the devices to further electrical circuitry, the package comprising:

a semiconductor device having a body and an active surface;

a lead frame having leads providing direct, in-line electrical contact perpendicular to the active surface of the semiconductor device thereby mininizing parasitic inductance and capacitance;

controlled-collapsed-chip-connection bumps connecting the lead frame directly and without intervening structure to the active surface of the semiconductor device;

at least one of a thermal slug and a ground slug and the controlled-collapsed-chip-connection bumps for attaching the slug directly and without intervening structure to the center of the active surface of the semiconductor device, and the slug is coextensive in one direction with the lead frame; and an encapsulation sealing the semiconductor device from the surrounding atmosphere.

2. The chip scale package of claim 1 wherein the semiconductor device is an integrated circuit chip.

3. The chip scale package of claim 1 wherein the C4 bumps are a tin and high lead composition.

4. The chip scale package of claim 1 wherein the lead frame is plated copper.

5. The chip scale package of claim 1 wherein the encapsulation provides electrical separation between the slug and the remainder of the lead frame.

6. The chip scale package of claim 1 wherein the encapsulation is selected from the group consisting of epoxies, silicones, polyurethanes, and polyimides.

7. The chip scale package of claim 1 wherein, for a given plane through the chip scale package, the dimensions of the chip scale package are about 25% larger than the dimensions of the semiconductor device.

8. The chip scale package of claim 1 wherein the lead frame has ends extending less than about 0.2 mm beyond the body of the semiconductor device.

9. A chip scale package for housing of semiconductor devices to facilitate handling, testing, and later attachment of the devices to further electrical circuitry, the package comprising:

a semiconductor device having a body and an active surface;

a lead frame and at least one of a thermal slug and a ground slug removing heat from the semiconductor device with minimal thermal resistance;

controlled-collapsed-chip-connection bumps connecting the lead frame directly and without intervening structure to the active surface of the semiconductor device, the controlled-collapsed-chip-connection bumps for attaching the slug directly and without intervening structure to the center of the active surface of the semiconductor device, and the slug is coextensive in one direction with the lead frame; and an encapsulation sealing the semiconductor device from the surrounding atmosphere.

10. The chip scale package of claim 9 wherein the lead frame has ends extending less than about 0.2 mm beyond the body of the semiconductor device, thereby minimizing parasitic inductance and capacitance.

11. The chip scale package of claim 9 wherein the semiconductor device is an integrated circuit chip.

12. The chip scale package of claim 9 wherein the encapsulation provides electrical separation between the slug and the remainder of the lead frame.

13. The chip scale package of claim 9 wherein, for a given plane through the chip scale package, the dimensions of the chip scale package are about 25% larger than the dimensions of the semiconductor device.

14. A chip scale package with outer dimensions for housing of semiconductor devices to facilitate handling, testing, and later attachment of the devices to further electrical circuitry, the package comprising:

a semiconductor device having a body, an active surface, and outer dimensions that are between about 70% and 80% of the outer dimensions of the chip scale package;

a lead frame having at least one of a thermal slug and a ground slug;

controlled-collapsed-chip-connection bumps connecting the lead frame directly and without intervening structure to the active surface of the semiconductor device, the controlled-collapsed-chip-connection bumps for attaching the slug directly and without intervening structure to the center of the active surface of the semiconductor device, and the slug is coextensive in one direction with the lead frame; and an encapsulation sealing the semiconductor device from the surrounding atmosphere.

15. The chip scale package of claim 14 wherein the semiconductor device is an integrated circuit chip.

16. The chip scale package of claim 14 wherein the lead frame has ends extending less than about 0.2 mm beyond the body of the semiconductor device, thereby minimizing parasitic inductance and capacitance.

* * * * *